United States Patent
Gao et al.

(10) Patent No.: US 8,623,770 B1
(45) Date of Patent: Jan. 7, 2014

(54) METHOD FOR SIDEWALL SPACER LINE DOUBLING USING ATOMIC LAYER DEPOSITION OF A TITANIUM OXIDE

(71) Applicant: HGST Netherlands B.V., Amsterdam (NL)

(72) Inventors: He Gao, San Jose, CA (US); Jeffrey S. Lille, Sunnyvale, CA (US); Kanaiyalal Chaturdas Patel, Fremont, CA (US)

(73) Assignee: HGST Netherlands B.V., Amsterdam (NL)

(*) Notice: Subject to any disclaimer, the term of this patent is extended or adjusted under 35 U.S.C. 154(b) by 0 days.

(21) Appl. No.: 13/772,669

(22) Filed: Feb. 21, 2013

(51) Int. Cl.
*H01L 21/311* (2006.01)
(52) U.S. Cl.
USPC ..... 438/701; 438/696; 438/785; 257/E21.236
(58) Field of Classification Search
USPC .......................................... 438/696, 701, 785
See application file for complete search history.

(56) References Cited

U.S. PATENT DOCUMENTS

| | | | |
|---|---|---|---|
| 7,611,980 B2 | 11/2009 | Wells et al. | |
| 7,732,343 B2 | 6/2010 | Niroomand et al. | |
| 7,758,981 B2 | 7/2010 | Albrecht | |
| 7,807,578 B2 | 10/2010 | Bencher et al. | |
| 7,910,288 B2 | 3/2011 | Abatchev et al. | |
| 8,211,803 B2 | 7/2012 | Sandhu et al. | |
| 2009/0146322 A1 | 6/2009 | Weling et al. | |
| 2009/0309161 A1* | 12/2009 | Chang | 257/368 |
| 2010/0267237 A1 | 10/2010 | Bonser et al. | |
| 2012/0119307 A1* | 5/2012 | Li et al. | 257/410 |
| 2013/0011987 A1* | 1/2013 | Park | 438/381 |
| 2013/0178053 A1* | 7/2013 | Li et al. | 438/586 |

OTHER PUBLICATIONS

Bencher et al., "22nm Half-Pitch Patterning by CVD Spacer Self Alignment Double Patterning (SADP)", Optical Microlithography XXI, edited by Harry J. Levinson, Mircea V. Dusa., Proc. of SPIE vol. 6924, 69244E, (2008)—0277-786X/08/$18-doi: 10.1117/12.772953.

* cited by examiner

*Primary Examiner* — Alexander Ghyka
(74) *Attorney, Agent, or Firm* — Thomas R. Berthold (57) ABSTRACT

A method for sidewall spacer line doubling uses thermal atomic layer deposition (ALD) of a titanium oxide (TiOx) spacer layer. A hardmask layer is deposited on a suitable substrate. A mandrel layer of diamond-like carbon (DLC) is deposited on the hardmask layer and patterned into stripes with tops and sidewalls. A layer of TiOx is deposited, by thermal ALD without the assistance of plasma or ozone, on the tops and sidewalls of the mandrel stripes. Thermal ALD of the $TiO_2$, without energy assistance by plasma or ozone, has been found to cause no damage to the DLC mandrel stripes. After removal of the TiOx from the tops of the mandrel stripes and removal of the mandrel stripes, stripes of $TiO_2$ are left on the hardmask layer and may be used as an etch mask to transfer the pattern into the hardmask layer.

18 Claims, 7 Drawing Sheets

FIG. 1A (Prior Art) Patterned Mandrel

FIG. 1B (Prior Art) Spacer Deposition

FIG. 1C (Prior Art) Anisotropic Etch Step

FIG. 1D (Prior Art) Mandrel Removal

FIG. 1E (Prior Art) Anisotropic Etch Step

FIG. 1F (Prior Art) Spacer Removal

METHOD FOR SIDEWALL SPACER LINE DOUBLING USING ATOMIC LAYER DEPOSITION OF A TITANIUM OXIDE

BACKGROUND OF THE INVENTION

1. Field of the Invention

This invention relates to line density multiplication in the area of nanotechnology, such as the fabrication of semiconductor devices and nanoimprint templates.

2. Description of the Related Art

Current photolithography has reached fundamental printing limits. One process that is gaining recognition for use in DRAM and NAND flash manufacturing is sidewall spacer "line doubling", sometimes also referred to as "line multiplication", "frequency doubling", or "pitch-halving". The process also has application in making nanoimprint templates, which may be used for making bit-patterned-media magnetic recording disks, for example as described in U.S. Pat. No. 7,758,981 B2 which is assigned to the same assignee as this application.

Figure 1A:
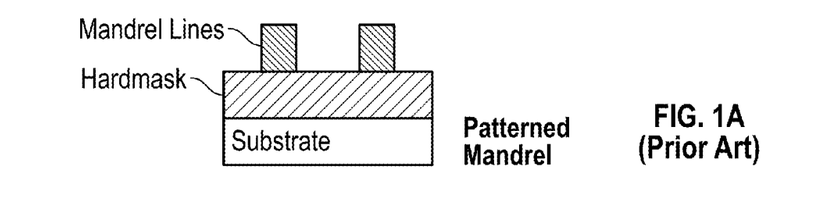
FIGS. 1A-1F are sectional views illustrating the general concept of sidewall spacer line doubling according to the prior art.
Figure 1B:
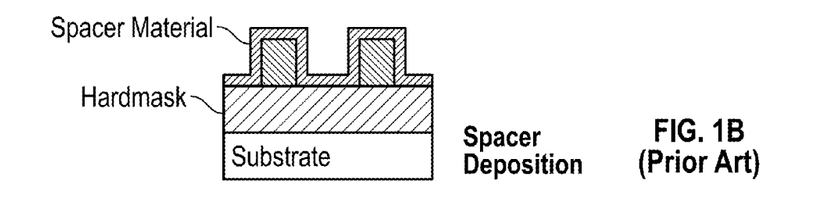
Figure 1C:
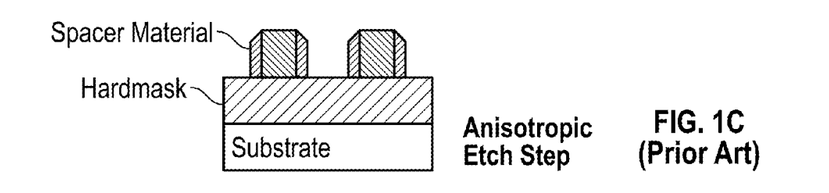
Figure 1D:
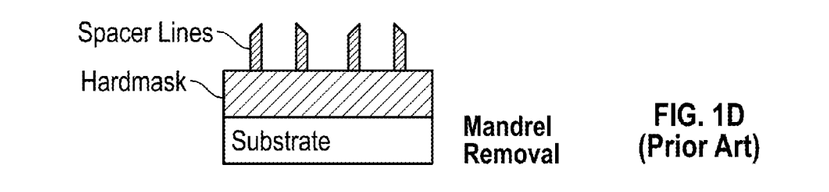
Figure 1E:
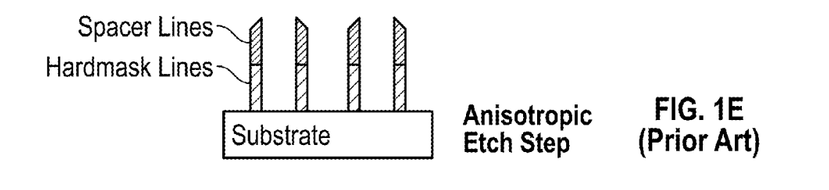
Figure 1F:
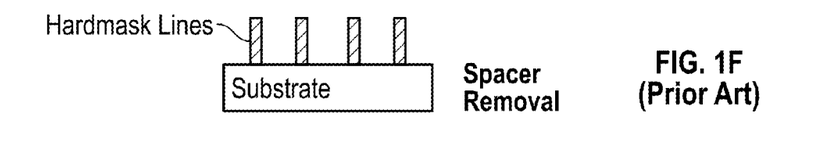

The process uses sidewall spacers to create patterned hardmasks as a means of doubling the printed line density. The process is illustrated in FIGS. 1A-1F. A layer of hardmask material is deposited on a substrate, and a layer of mandrel material (which may be a photoresist) is patterned into lines on the hardmask layer (FIG. 1A). A conformal layer of spacer material is deposited on the tops and sides of the mandrel lines and on the hardmask layer in the gaps between the mandrel lines (FIG. 1B). The spacer material on the tops of the mandrel lines and in the gaps between the mandrel lines is then removed by anisotropic etching, leaving the mandrel lines with sidewalls of spacer material (FIG. 1C). The material of the mandrel lines is then removed, leaving lines of sidewall spacer material on the hardmask layer (FIG. 1D). The number of spacer lines in FIG. 1D is double the number of mandrel lines in FIG. 1A, and thus the pitch of the spacer lines is half the pitch of the mandrel lines, hence the terms "line doubling" and "pitch halving". The spacer lines are then used as an etch mask to transfer the pattern into the hardmask (FIG. 1E) and the spacer lines are then removed, leaving a pattern of hardmask lines on the substrate (FIG. 1E).

Atomic layer deposition (ALD) is one method of depositing various types of spacer materials. ALD is a thin film deposition process that is based on the sequential use of a gas phase chemical process, in which by repeatedly exposing gas phase chemicals known as the precursors to the growth surface and activating them at elevated temperature, a precisely controlled thin film is deposited in a conformal manner. Many ALD processes are "energy-assisted", meaning that they are performed with the assistance from a plasma or ozone.

What is needed is a sidewall spacer line doubling process that uses an ALD process that enables new sets of materials for the mandrel and spacer material.

SUMMARY OF THE INVENTION

The invention relates to a method for sidewall spacer line doubling using thermal atomic layer deposition (ALD) of a titanium oxide (TiOx) spacer layer. A hardmask layer is deposited on a suitable substrate. An optional transfer layer may deposited on the hardmask layer. A mandrel layer, preferably a layer of diamond-like carbon (DLC) is deposited on the hardmask layer or optional transfer layer. The mandrel layer is patterned into a plurality of stripes with tops and sidewalls. A layer of spacer material, consisting essentially of titanium dioxide ($TiO_2$), is deposited, by thermal ALD without the assistance of plasma or ozone, on the tops and sidewalls of the mandrel stripes and on the hardmask layer between the mandrel stripes. Thermal ALD of the $TiO_2$, without energy assistance by plasma or ozone, has been found to cause no damage to DLC mandrel stripes. The spacer material on the tops of the mandrel stripes and on the hardmask layer between the mandrel stripes is then removed by anisotropic etching, leaving the mandrel stripes and sidewall $TiO_2$ spacer material. Then the mandrel stripes are etched away, leaving stripes of $TiO_2$ sidewall spacer material on the hardmask layer. The $TiO_2$ stripes are used as an etch mask to etch away the exposed hardmask layer. The $TiO_2$ stripes are removed, leaving a pattern of hardmask stripes on the substrate that is double the number of original mandrel stripes. The patterned hardmask may be used as an etch mask to transfer the pattern into the substrate.

For a fuller understanding of the nature and advantages of the present invention, reference should be made to the following detailed description taken together with the accompanying figures.

DETAILED DESCRIPTION OF THE INVENTION

Atomic layer deposition (ALD) is a thin film deposition process that is based on the sequential use of a gas phase chemical process, in which by repeatedly exposing gas phase chemicals known as the precursors to the growth surface and activating them at elevated temperature, with or without the assistance from a plasma or ozone, a precisely controlled thin film is deposited in a conformal manner. If plasma is involved in the deposition, the technique is referred to as "plasma-enhanced" ALD, or PEALD. If ozone is used in the deposition, the process is called "ozone-assisted" ALD. PEALD and ozone-assisted ALD are both referred to as "energy-assisted" ALD. When the precursors are activated without additional energy assistance from plasma or ozone, the technique would be referred to as "thermal" ALD.

In the method of this invention, it has been discovered that conformal coating of a titanium oxide (TiOx) spacer material over mandrel lines of diamond-like carbon (DLC) occurs without damage to the DLC mandrel lines if thermal ALD is used. However if either plasma or ozone is involved during the deposition of the TiOx spacer material, the narrow DLC mandrel lines may be damaged. Thus in the process of this invention the deposition of TiOx by ALD does not involve the use of plasma or ozone. Thermal ALD, without energy assistance by plasma or ozone causes no damage to the mandrel lines.

Figure 2A:
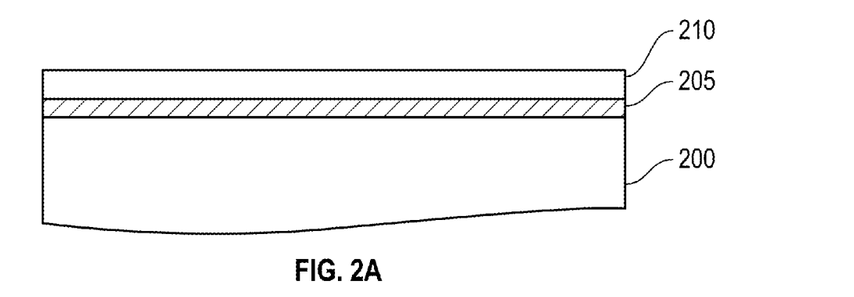
FIGS. 2A-2M illustrate the method of sidewall spacer line doubling according to the invention.

The sidewall spacer line doubling method of this invention using thermal ALD of TiOx will be described with FIGS. 1A-1M. Referring to FIG. 2A, the substrate 200 is a suitable material which may be, but is not limited to, Si, fused silica, or glass, and which may also be coated with materials such as a silicon oxide, a silicon nitride, carbon, tantalum, molybdenum, chromium, alumina or sapphire. A hardmask layer 205 of a material that is resistant to the subsequent etch chemistry of the substrate 205 is deposited on the substrate 200. The hardmask layer may be, but is not limited to, a metal such as Cr, or an oxide or nitride of Cr (CrOx or CrNx) of between about 3-10 nm thickness, or carbon, such as DLC, of between about 10-100 nm thickness. An optional transfer layer 210 is deposited on the hardmask layer 205. The material of the transfer layer may be, but is not limited to, amorphous Si, or a silicon nitride (SiNx). The thickness of the transfer layer is typically between about 3-20 nm. The transfer layer 210 facilitates adhesion between the hardmask layer 205 and the subsequently deposited DLC layer, and allows over etching of the spacer material for a wider process window during the later etch-back without damaging the hardmask layer which may result in uneven etch depth in subsequent steps.

Figure 2B:
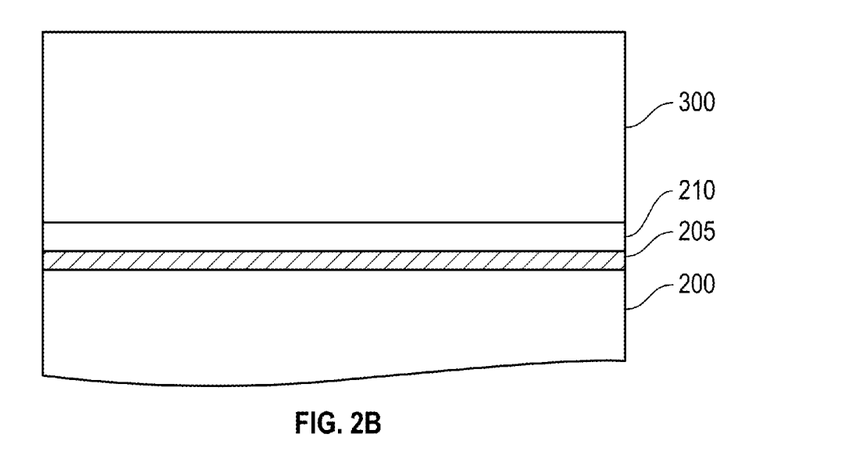

In FIG. 2B, a mandrel layer 300 is deposited on the transfer layer 210. If the optional transfer layer 210 is not used, then the mandrel layer 300 is deposited on the hardmask layer 205, or on an adhesion layer (not shown) formed on the hardmask layer. The preferred material of the mandrel layer 300 to work with TiOx spacers deposited by thermal ALD (described below) is diamond-like-carbon (DLC). The mandrel layer 300 of DLC can be deposited using chemical vapor deposition (CVD) or physical vapor deposition (PVD). The strong mechanical property of DLC, as compared to other polymeric based materials, ensures high pattern fidelity, especially for critical dimensions less than 20 nm. The thickness of the mandrel layer 300 is determined by the desired pattern size and height, but is generally between about 10-300 nm. Additional layers of materials (not shown), such as a resist or block copolymer and/or a hardmask material (dissimilar to hardmask layer 205) such as $SiO_2$ or SiNx, may be deposited on top of the mandrel layer 300 for the initial patterning to allow the lithography and transfer etching into the mandrel layer 300 in the next step.

Figure 2C:
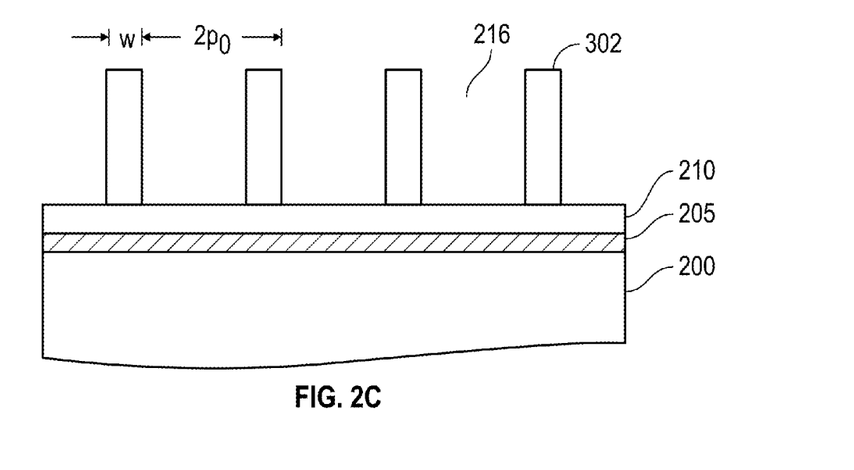
Figure 2D:
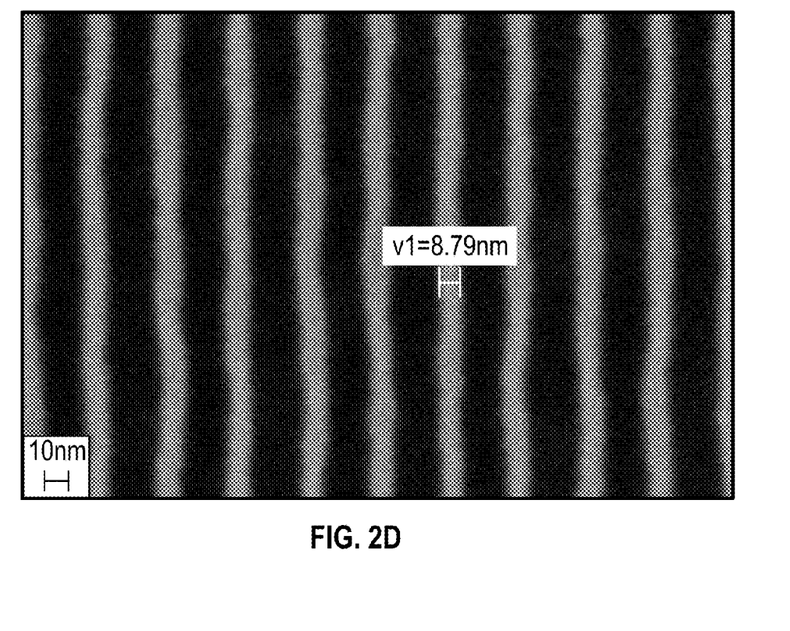

In FIG. 2C the mandrel layer is patterned into periodic stripes 302. The patterning into the stripes 302 may be achieved using e-beam lithography, optical lithography, nanoimprint lithography, directed self assembly of block copolymers, or a combination thereof, and related etch techniques. The periodic stripes 302 pitch, in the direction parallel to the substrate and orthogonal to the stripes, is $2p_0$, i.e., two times the desired pitch of the final line patterns. The width (w) of the stripes 302 must be less than the final pitch $p_0$ of the final line patterns. The choice of the width (w) is typically chosen to be close to $p_0/2$, half of the desired pitch of the final line patterns. Portions of the underlying transfer layer 210 are exposed in the gaps 216 between stripes 302. The width of gaps 216 at this step is $2p_0-w$, the difference between two times the pitch $p_0$ of the final lines and the mandrel stripe width w. In the present example, the initial patterning is done using e-beam directed self-assembly of a block copolymer polystyrene-block-polymethylmethacrylate (PS-b-PMMA), followed by pattern transfer into the DLC. The desired pitch $p_0$ of the final patterns is approximately 14.5 nm, and therefore the pitch of DLC stripes 302 is patterned to be 29 nm. The width w of DLC stripes 302 is approximately 8.8 nm. FIG. 2D is a scanning electron microscopy (SEM) image top view of the structure represented by FIG. 2C, where the lighter lines are the DLC lines 302 with a 29 nm pitch and the darker lines are transfer layer 205 in the gaps 216. The stripes 302 may be patterned as parallel generally straight stripes if the resulting etched substrate is to be used in a semiconductor device. The stripes 302 may be patterned as either generally radial stripes or generally concentric circular stripes if the resulting etched substrate is to be used as an imprint mold for making bit-patterned-media magnetic recording disks.

Figure 2E:
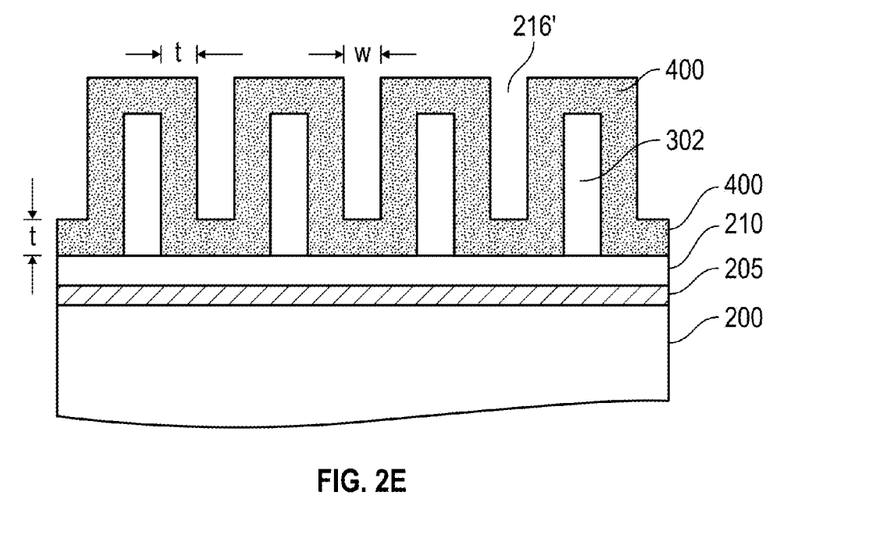
Figure 2F:
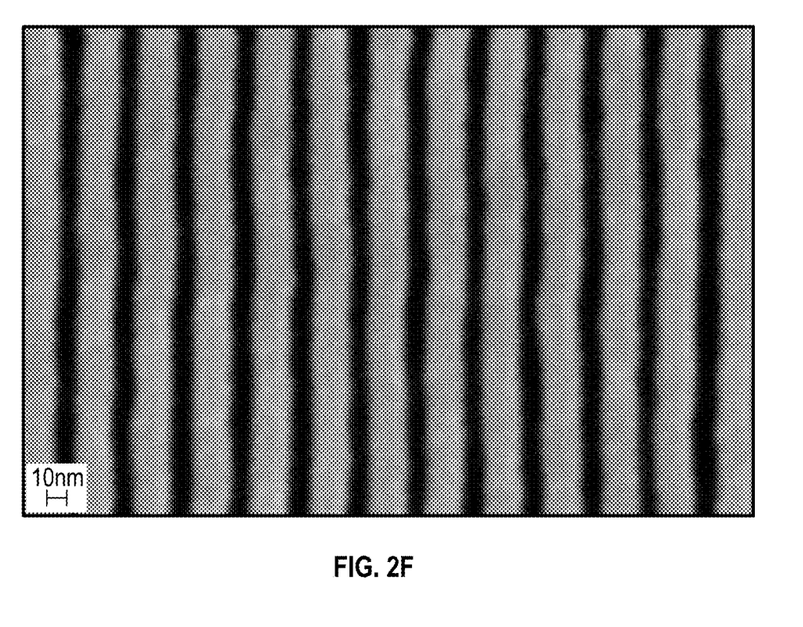

In the next step, shown in FIG. 2E, a titanium oxide (TiOx) spacer layer 400 is deposited on the top and sidewalls of DLC stripes 302, as well as on the portions of the transfer layer 210 in gaps 216. The layer 400 is deposited in a conformal manner to a uniform thickness t, using thermal atomic layer deposition (ALD), while the substrate is heated to a temperature between about 100° C. and 300° C., without the use of plasma or ozone. The thickness t is chosen to be $p_0-w$, the difference between the desired pitch of the final line patterns and the width of the DLC stripes 302. At this step, the width of the gaps 216' is reduced to w. In the present example, the thermal ALD of TiOx is carried out at 250° C. The precursors used for TiOx deposition were tetrakis(dimethylamido)titanium (TD-MAT) and water vapor. Alternatively, other titanium containing precursors could be used in conjunction with water, such as titanium tetrachloride ($TiCl_4$) and titanium butoxide (Ti$(OBu)_4$). The TiOx layer 400 deposited by thermal ALD in this manner consists essentially of titanium dioxide ($TiO_2$). The targeted thickness t of the TiOx layer is approximately 5.7 nm. FIG. 2F shows a top view SEM image of a section of the TiOx coated lines of 29 nm pitch, where the lighter lines is the TiOx on top of the DLC stripes 302 and the darker lines is the TiOx in the narrowed gaps 216'.

Figure 2G:
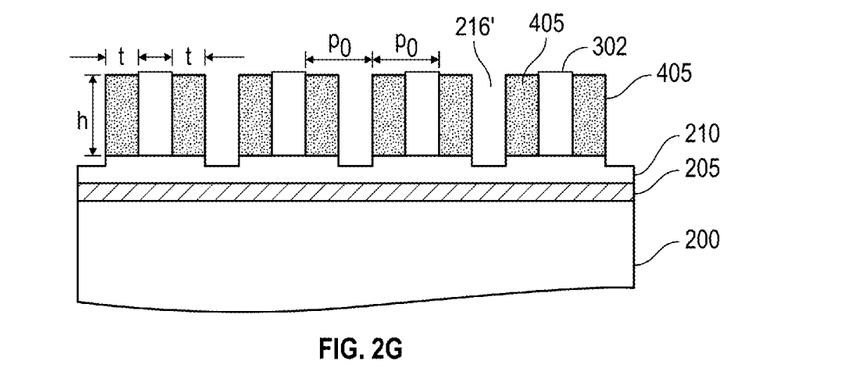
Figure 2H:
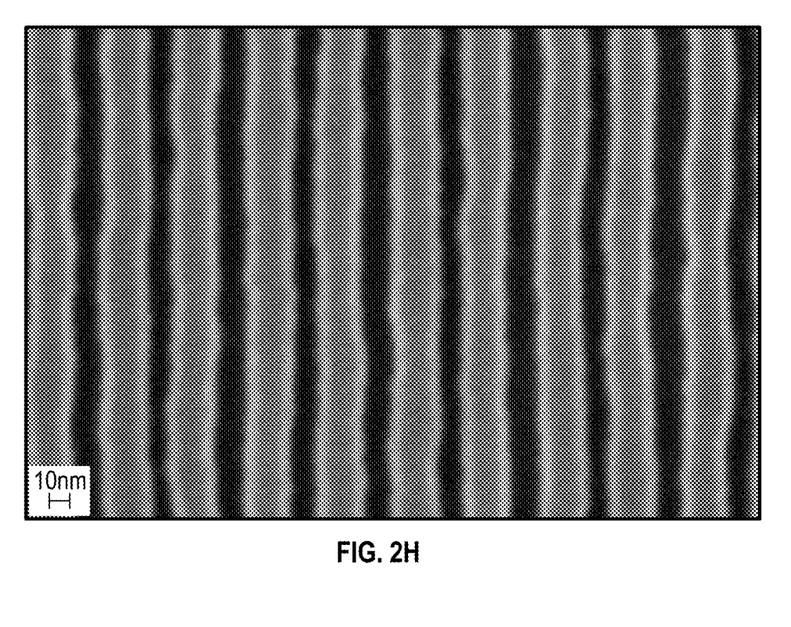

Next, as shown in FIG. 2G, an anisotropic etch in a direction perpendicular to the substrate surface is carried out to etch back the TiOx spacer material. The etch-back of TiOx can be done using reactive ion etching (RIE) with an etchant gas containing fluorine and/or chlorine or by ion beam (Ar) etching. The DLC stripes 302 may also be shortened by the etch chemistry. The vertical thickness of the spacer material to be removed by the etch step should be at least t, the initial layer thickness of the TiOx spacer material. This will ensure the removal of the TiOx spacer material on top of DLC stripes 302, and in the narrowed gaps 216', leaving only stripes 405 of TiOx spacer material covering the sidewalls of DLC stripes 302. An overetch of the spacer material (vertical thickness removed more than t) is typically used to allow a wide process window, and therefore portions of the transfer layer 210 may also be etched in the narrowed gaps 216'. Hardmask layer 205 is not etched in this step. The lateral width of all TiOx spacer stripes 405 is t, the as-deposited thickness of TiOx. The TiOx stripes 405 have a pitch of $p_0$, the desired pitch of the final patterns. In the present example, the etch process is a fluorine-containing RIE process, and the resulting height h of TiOx spacers 405 is approximately 14 nm. A top view SEM image of the structure represented by FIG. 2G is shown in FIG. 2H, in which the light lines are the remaining TiOx 405 spacer lines, the gray lines are the DLC stripes 302, and the dark lines are the narrowed gaps 216'.

The remaining mandrel stripes 302 are subsequently removed. In the case where the DLC is the preferred mandrel material, the removal can be done using an oxygen-containing (e.g., $O_2$, CO, $CO_2$) RIE, or a hydrogen-containing RIE, or a combination thereof. In the resulting structure shown in FIG. 2I, only TiOx spacers 405 of pitch $p_0$ and width t are left on top of the transfer layer 210, separated by gaps 216' and 316. A top view SEM image of the structure represented by FIG. 2I is shown in FIG. 2J, in which the light lines are the remaining TiOx spacer stripes with a 14.5 nm pitch.

Figure 2I:
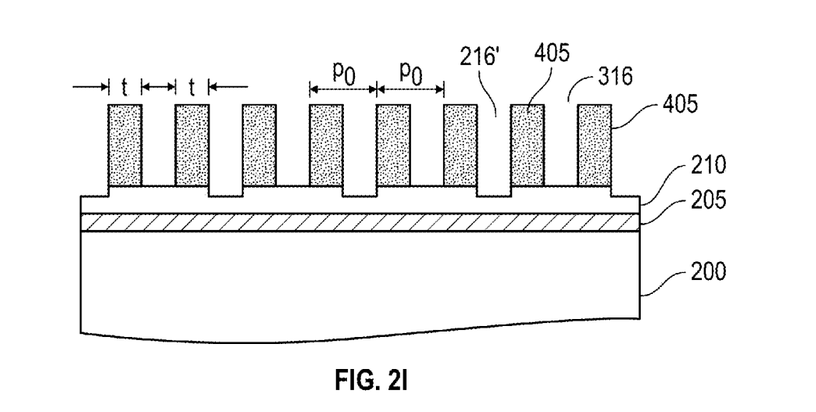
Figure 2J:
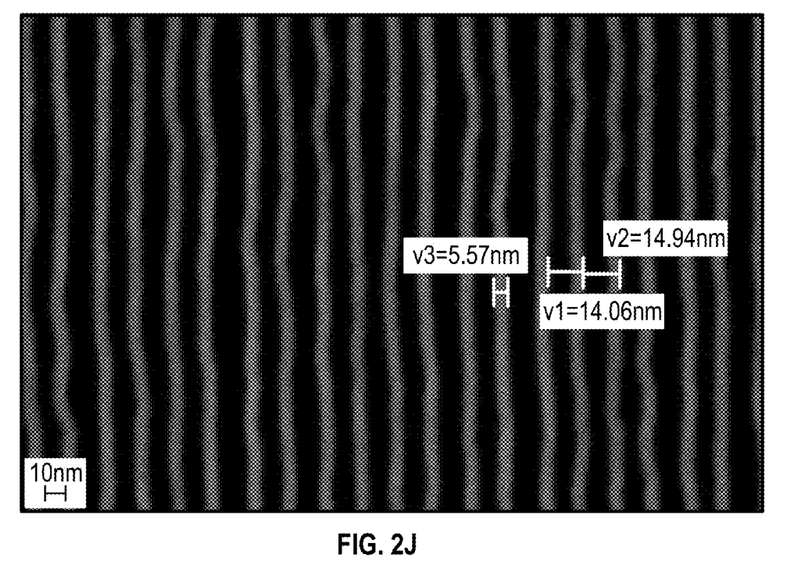
Figure 2K:
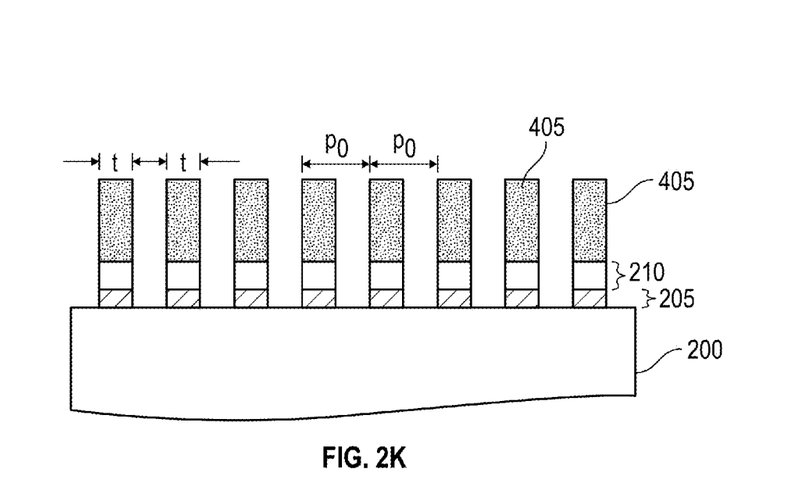

The line patterns 405 defined by TiOx spacers in FIG. 2I can be transferred to the hardmask layer 205 through two etch steps, the first step etches through the transfer layer 210, and the second etch step through the hardmask layer 205. The resulting structure is shown in FIG. 2K. The first step may be a fluorine-containing RIE if the material of the transfer layer 210 is Si or SiNx. The second etch step can be an oxygen containing (e.g., $O_2$, CO, $CO_2$) RIE if the material of the hardmask 205 is DLC, or a chlorine-containing RIE or an ion beam etch if the material of the hardmask layer 205 is Cr (or CrOx or CrNx). During the two etch steps, the TiOx spacers 405 may also be shortened by the etch chemistry or ion bombardment.

Figure 2L:
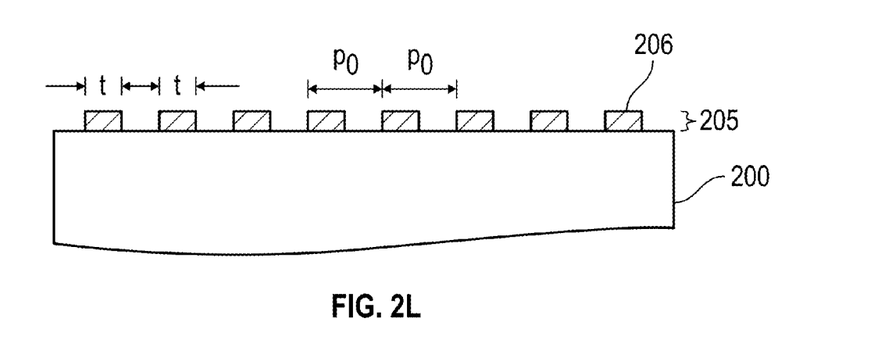

To ensure a complete and uniform pattern transfer into the substrate, it is preferred to remove the remaining TiOx spacers 405 after the patterning of the hardmask layer 205. The TiOx spacers can be removed in boiled sulfuric acid ($H_2SO_4$), or a mixture of $H_2SO_4$ and hydrogen peroxide ($H_2O_2$). It is also optional to remove the remaining material of transfer layer 210 using wet chemistry such as hydrofluoric acid (HF). The resulting structure is shown in FIG. 2L, with only patterned hardmask stripes 206 remaining on top of the substrate 200.

Figure 2M:
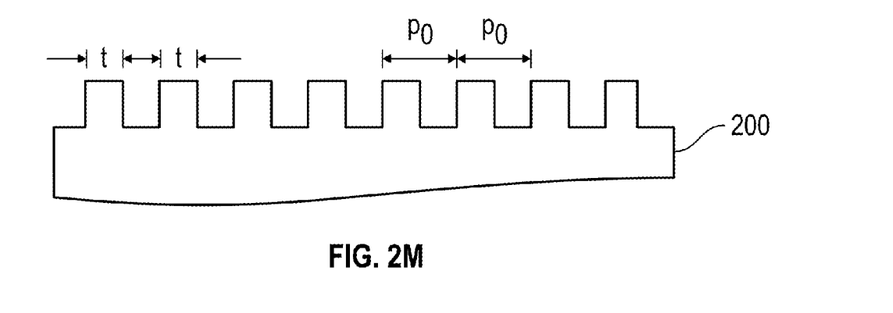

The line patterns with pitch $p_0$ may then be etched into the substrate 200 with the patterned hardmask layer 205, followed by the removal of the hardmask layer. The final structure, stripes of substrate pillars (or recesses) with pitch $p_0$ in the substrate 200, is shown in FIG. 2M.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for sidewall spacer line doubling on a substrate comprising:
    providing a substrate;
    depositing on the substrate a hardmask layer;
    depositing on the hardmask layer a mandrel layer;
    patterning the mandrel layer into a plurality of stripes on the hardmask layer, the mandrel stripes having tops and sidewalls;
    depositing, by thermal atomic layer deposition without plasma assistance and without ozone assistance, a titanium oxide spacer layer on the tops and sidewalls of the mandrel stripes and on the hardmask layer between the mandrel stripes;
    etching away the spacer layer on the tops of the mandrel stripes and on the hardmask layer between the mandrel stripes, leaving the mandrel stripes and sidewall spacers;
    etching away the mandrel stripes, leaving stripes of sidewall spacers on the hardmask layer;
    etching away the hardmask, using the stripes of sidewall spacers as an etch mask; and
    removing the stripes of sidewall spacers, leaving stripes of hardmask layer on the substrate.

2. The method of claim 1 wherein depositing on the hardmask layer a mandrel layer comprises depositing a layer of diamond-like carbon (DLC).

3. The method of claim 1 wherein etching away the spacer material on the tops of the mandrel stripes and on the hardmask layer between the mandrel stripes comprises etching by one of Ar ion beam etching and reactive ion etching (RIE) with an etchant gas containing one or both of fluorine and chlorine.

4. The method of claim 1 wherein etching away the mandrel stripes comprises etching by reactive ion etching (RIE) with an etchant gas containing one or both of oxygen and hydrogen.

5. The method of claim 1 further comprising:
    after depositing the hardmask layer, depositing a transfer layer on the hardmask layer;
    after etching away the mandrel stripes, leaving stripes of sidewall spacer material on the transfer layer, etching away the transfer layer using the stripes of sidewall spacers as an etch mask, leaving stripes of sidewall spacers on stripes of transfer layer; and
    then etching away the hardmask, using the stripes of sidewall spacers on the stripes of transfer layer as an etch mask.

6. The method of claim 1 further comprising, after removing the stripes of sidewall spacers:
    etching the substrate, using the stripes of hardmask layer as an etch mask; and
    removing the stripes of hardmask layer.

7. The method of claim 1 wherein the mandrel stripes have a pitch in a direction parallel to the substrate and orthogonal to the mandrel stripes of $2p_0$ and the sidewall spacer stripes have a pitch in a direction parallel to the substrate and orthogonal to the sidewall spacer stripes of $p_0$.

8. The method of claim 1 wherein the mandrel stripes have a width w, and wherein depositing the spacer layer comprises depositing the spacer layer to a thickness t, wherein t is approximately equal to $p_0-w$.

9. The method of claim 1 wherein patterning the mandrel layer into a plurality of stripes comprises patterning the mandrel layer into a pattern selected from parallel generally straight stripes, generally radial stripes, and generally concentric circular stripes.

10. A method for sidewall spacer line doubling on a substrate comprising:
    providing a substrate;
    depositing on the substrate a hardmask layer;
    depositing on the hardmask layer a diamond-like carbon (DLC) layer;
    patterning the DLC layer into a plurality of stripes on the hardmask layer, the DLC stripes having tops and sidewalls;
    depositing, while the substrate is at a temperature between 100 and 300° C., by atomic layer deposition without plasma assistance and without ozone assistance, a spacer layer consisting essentially of titanium dioxide on the tops and sidewalls of the DLC stripes and on the hardmask layer between the DLC stripes;
    etching away the spacer layer on the tops of the DLC stripes and on the hardmask layer between the DLC stripes, leaving the DLC stripes and sidewall spacers; and
    etching away the DLC stripes, leaving stripes of sidewall spacers on the hardmask layer;
    etching away the hardmask, using the stripes of sidewall spacers as an etch mask; and
    removing the stripes of sidewall spacers, leaving stripes of hardmask layer on the substrate.

11. The method of claim 10 further comprising:
    etching the substrate, using the stripes of hardmask layer as an etch mask; and
    removing the stripes of hardmask layer.

12. The method of claim 10 further comprising:
    after depositing the hardmask layer, depositing a transfer layer on the hardmask layer; and
    after etching away the DLC stripes, leaving stripes of sidewall spacer material on the transfer layer, etching away the transfer layer using the stripes of sidewall spacers as an etch mask, leaving stripes of sidewall spacers on stripes of transfer layer; and
    then etching away the hardmask, using the stripes of sidewall spacers on the stripes of transfer layer as an etch mask.

13. The method of claim 10 wherein depositing the spacer layer by atomic layer deposition comprises using as gaseous precursors tetrakis(dimethylamido)titanium (TDMAT) and water vapor.

14. The method of claim 10 wherein depositing the spacer layer by atomic layer deposition comprises using as gaseous precursors tetrachloride (TiCl4) and water vapor.

15. The method of claim 10 wherein depositing the spacer layer by atomic layer deposition comprises using as gaseous precursors titanium butoxide $(Ti(OBu)_4)$ and water vapor.

16. The method of claim 10 wherein the DLC stripes have a pitch in a direction parallel to the substrate and orthogonal to the DLC stripes of $2p_0$ and the sidewall spacer stripes have a pitch in a direction parallel to the substrate and orthogonal to the sidewall spacer stripes of $p_0$.

17. The method of claim 10 wherein the DLC stripes have a width w, and wherein depositing the spacer layer comprises depositing the spacer layer to a thickness t, wherein t is approximately equal to $p_0-w$.

18. The method of claim 10 wherein patterning the DLC layer into a plurality of stripes comprises patterning the DLC layer into a pattern selected from parallel generally straight stripes, generally radial stripes, and generally concentric circular stripes.

\* \* \* \* \*